United States Patent
Singh (10) Patent No.: US 9,306,560 B2
(45) Date of Patent: Apr. 5, 2016

(54) SELF-CAPACITANCE DETECTION USING TRANS-CONDUCTANCE REFERENCE

(75) Inventor: Tajeshwar Singh, Sør Trøndelag (NO)

(73) Assignee: Atmel Corporation, San Jose, CA (US)

( * ) Notice: Subject to any disclaimer, the term of this patent is extended or adjusted under 35 U.S.C. 154(b) by 863 days.

(21) Appl. No.: 13/471,094

(22) Filed: May 14, 2012

(65) Prior Publication Data

US 2013/0300438 A1  Nov. 14, 2013

(51) Int. Cl.
*G01R 27/26* (2006.01)
*H03K 17/955* (2006.01)
*G06F 3/044* (2006.01)

(52) U.S. Cl.
CPC .............. *H03K 17/955* (2013.01); *G06F 3/044* (2013.01); *H03K 2217/94026* (2013.01); *H03K 2217/960725* (2013.01)

(58) Field of Classification Search
CPC ................ H03K 2217/960725; H03K 17/955; H03K 17/962; G06F 3/044; G01R 27/2605
USPC .............. 178/18.06, 19.03; 324/37, 658–690; 345/173, 174
See application file for complete search history.

(56) References Cited

U.S. PATENT DOCUMENTS

| | | | |
|---|---|---|---|
| 7,663,607 B2 | 2/2010 | Hotelling | |
| 7,875,814 B2 | 1/2011 | Chen | |
| 7,920,129 B2 | 4/2011 | Hotelling | |
| 8,031,094 B2 | 10/2011 | Hotelling | |
| 8,031,174 B2 | 10/2011 | Hamblin | |
| 8,040,326 B2 | 10/2011 | Hotelling | |
| 8,049,732 B2 | 11/2011 | Hotelling | |
| 8,179,381 B2 | 5/2012 | Frey | |
| 8,896,327 B2 * | 11/2014 | Brunet et al. ................. | 324/679 |
| 2009/0153152 A1 * | 6/2009 | Maharyta et al. ............ | 324/684 |
| 2009/0315854 A1 | 12/2009 | Matsuo | |
| 2012/0043971 A1 * | 2/2012 | Maharyta .......... G01R 27/2605 324/658 |
| 2012/0092297 A1 * | 4/2012 | Han .............................. | 345/174 |
| 2012/0242588 A1 | 9/2012 | Myers | |
| 2012/0242592 A1 | 9/2012 | Rothkopf | |
| 2012/0243151 A1 | 9/2012 | Lynch | |
| 2012/0243719 A1 | 9/2012 | Franklin | |
| 2013/0234976 A1 * | 9/2013 | Brillant .................. G06F 3/044 345/174 |

FOREIGN PATENT DOCUMENTS

WO   WO 2012/129247   9/2012

OTHER PUBLICATIONS

U.S. Appl. No. 61/454,936, filed Mar. 21, 2011, Myers.
U.S. Appl. No. 61/454,950, filed Mar. 21, 2011, Lynch.
U.S. Appl. No. 61/454,894, filed Mar. 21, 2011, Rothkopf.

\* cited by examiner

*Primary Examiner* — Daniel Miller
(74) *Attorney, Agent, or Firm* — Baker Botts L.L.P.

(57) ABSTRACT

In one embodiment, a method includes modifying a voltage at a capacitance of a touch sensor to a first voltage level. The method also includes modifying the voltage at the capacitance to a second voltage level, resulting in a first current. The method also includes modifying a voltage at an integration capacitor to a charging-voltage level based on the first current. The method also includes determining whether a touch input to the touch sensor has occurred based on the charging-voltage level.

14 Claims, 6 Drawing Sheets

SELF-CAPACITANCE DETECTION USING TRANS-CONDUCTANCE REFERENCE

TECHNICAL FIELD

This disclosure generally relates to touch sensors.

BACKGROUND

A touch sensor may detect the presence and location of a touch or the proximity of an object (such as a user's finger or a stylus) within a touch-sensitive area of the touch sensor overlaid on a display screen, for example. In a touch-sensitive-display application, the touch sensor may enable a user to interact directly with what is displayed on the screen, rather than indirectly with a mouse or touch pad. A touch sensor may be attached to or provided as part of a desktop computer, laptop computer, tablet computer, personal digital assistant (PDA), smartphone, satellite navigation device, portable media player, portable game console, kiosk computer, point-of-sale device, or other suitable device. A control panel on a household or other appliance may include a touch sensor.

There are a number of different types of touch sensors, such as (for example) resistive touch screens, surface acoustic wave touch screens, and capacitive touch screens. Herein, reference to a touch sensor may encompass a touch screen, and vice versa, where appropriate. When an object touches or comes within proximity of the surface of the capacitive touch screen, a change in capacitance may occur within the touch screen at the location of the touch or proximity. A touch-sensor controller may process the change in capacitance to determine its position on the touch screen.

DESCRIPTION OF EXAMPLE EMBODIMENTS

Figure 1:
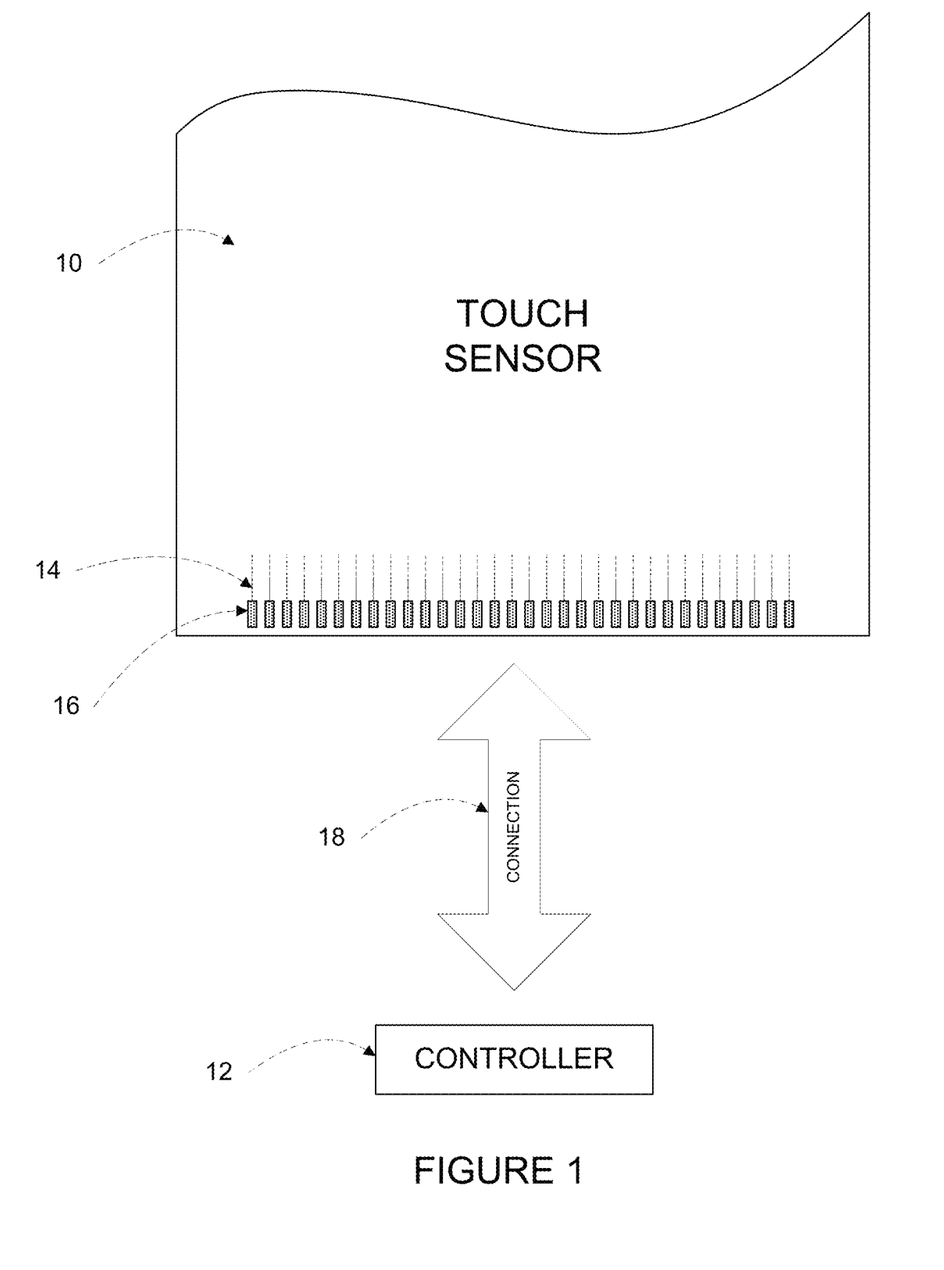
FIG. 1 illustrates an example touch sensor with an example touch-sensor controller.

FIG. 1 illustrates an example touch sensor with an example touch-sensor controller. Touch sensor 10 and touch-sensor controller 12 may detect the presence and location of a touch or the proximity of an object within a touch-sensitive area of touch sensor 10. Herein, reference to a touch sensor may encompass both the touch sensor and its touch-sensor controller, where appropriate. Similarly, reference to a touch-sensor controller may encompass both the touch-sensor controller and its touch sensor, where appropriate. Touch sensor 10 may include one or more touch-sensitive areas, where appropriate. Touch sensor 10 may include an array of drive and sense electrodes (or an array of electrodes of a single type) disposed on one or more substrates, which may be made of a dielectric material. Herein, reference to a touch sensor may encompass both the electrodes of the touch sensor and the substrate(s) that they are disposed on, where appropriate. Alternatively, where appropriate, reference to a touch sensor may encompass the electrodes of the touch sensor, but not the substrate(s) that they are disposed on.

An electrode (whether a ground electrode, a guard electrode, a drive electrode, or a sense electrode) may be an area of conductive material forming a shape, such as for example a disc, square, rectangle, thin line, other suitable shape, or suitable combination of these. One or more cuts in one or more layers of conductive material may (at least in part) create the shape of an electrode, and the area of the shape may (at least in part) be bounded by those cuts. In particular embodiments, the conductive material of an electrode may occupy approximately 100% of the area of its shape. As an example and not by way of limitation, an electrode may be made of indium tin oxide (ITO) and the ITO of the electrode may occupy approximately 100% of the area of its shape (sometimes referred to as 100% fill), where appropriate. In particular embodiments, the conductive material of an electrode may occupy substantially less than 100% of the area of its shape. As an example and not by way of limitation, an electrode may be made of fine lines of metal or other conductive material (FLM), such as for example copper, silver, or a copper- or silver-based material, and the fine lines of conductive material may occupy approximately 5% of the area of its shape in a hatched, mesh, or other suitable pattern. Herein, reference to FLM encompasses such material, where appropriate. Although this disclosure describes or illustrates particular electrodes made of particular conductive material forming particular shapes with particular fill percentages having particular patterns, this disclosure contemplates any suitable electrodes made of any suitable conductive material forming any suitable shapes with any suitable fill percentages having any suitable patterns.

Where appropriate, the shapes of the electrodes (or other elements) of a touch sensor may constitute in whole or in part one or more macro-features of the touch sensor. One or more characteristics of the implementation of those shapes (such as, for example, the conductive materials, fills, or patterns within the shapes) may constitute in whole or in part one or more micro-features of the touch sensor. One or more macro-features of a touch sensor may determine one or more characteristics of its functionality, and one or more micro-features of the touch sensor may determine one or more optical features of the touch sensor, such as transmittance, refraction, or reflection.

A mechanical stack may contain the substrate (or multiple substrates) and the conductive material forming the drive or sense electrodes of touch sensor 10. As an example and not by way of limitation, the mechanical stack may include a first layer of optically clear adhesive (OCA) beneath a cover panel. The cover panel may be clear and made of a resilient material suitable for repeated touching, such as for example glass, polycarbonate, or poly(methyl methacrylate) (PMMA). This disclosure contemplates any suitable cover panel made of any suitable material. The first layer of OCA may be disposed between the cover panel and the substrate with the conductive material forming the drive or sense electrodes. The mechanical stack may also include a second layer of OCA and a dielectric layer (which may be made of PET or another suitable material, similar to the substrate with the conductive material forming the drive or sense electrodes). As an alternative, where appropriate, a thin coating of a dielectric material may be applied instead of the second layer of OCA and the dielectric layer. The second layer of OCA may be disposed between the substrate with the conductive material making up the drive or sense electrodes and the dielectric layer, and the dielectric layer may be disposed between the second layer of OCA and an air gap to a display of a device including touch sensor 10 and touch-sensor controller 12. As an example only and not by way of limitation, the cover panel may have a thickness of approximately 1 millimeter (mm); the first layer of OCA may have a thickness of approximately 0.05 mm; the substrate with the conductive material forming the drive or sense electrodes may have a thickness of approximately 0.05 mm; the second layer of OCA may have a thickness of approximately 0.05 mm; and the dielectric layer may have a thickness of approximately 0.05 mm. Although this disclosure describes a particular mechanical stack with a particular number of particular layers made of particular materials and having particular thicknesses, this disclosure contemplates any suitable mechanical stack with any suitable number of any suitable layers made of any suitable materials and having any suitable thicknesses. As an example and not by way of limitation, in particular embodiments, a layer of adhesive or dielectric may replace the dielectric layer, second layer of OCA, and air gap described above, with there being no air gap to the display.

One or more portions of the substrate of touch sensor 10 may be made of polyethylene terephthalate (PET) or another suitable material. This disclosure contemplates any suitable substrate with any suitable portions made of any suitable material. In particular embodiments, the drive or sense electrodes in touch sensor 10 may be made of ITO in whole or in part. In particular embodiments, the drive or sense electrodes in touch sensor 10 may be made of fine lines of metal or other conductive material. As an example and not by way of limitation, one or more portions of the conductive material may be copper or copper-based and have a thickness of approximately 5 microns ($\mu$m) or less and a width of approximately 10 $\mu$m or less. As another example, one or more portions of the conductive material may be silver or silver-based and similarly have a thickness of approximately 5 $\mu$m or less and a width of approximately 10 $\mu$m or less. This disclosure contemplates any suitable electrodes made of any suitable material.

Touch sensor 10 may implement a capacitive form of touch sensing. In a mutual-capacitance implementation, touch sensor 10 may include an array of drive and sense electrodes forming an array of capacitive nodes. A drive electrode and a sense electrode may form a capacitive node. The drive and sense electrodes forming the capacitive node may come near each other, but not make electrical contact with each other. Instead, the drive and sense electrodes may be capacitively coupled to each other across a space between them. A pulsed or alternating voltage applied to the drive electrode (by touch-sensor controller 12) may induce a charge on the sense electrode, and the amount of charge induced may be susceptible to external influence (such as a touch or the proximity of an object). When an object touches or comes within proximity of the capacitive node, a change in capacitance may occur at the capacitive node and touch-sensor controller 12 may measure the change in capacitance. By measuring changes in capacitance throughout the array, touch-sensor controller 12 may determine the position of the touch or proximity within the touch-sensitive area(s) of touch sensor 10.

In a self-capacitance implementation, touch sensor 10 may include an array of electrodes that may each form a capacitive node. When an object touches or comes within proximity of the capacitive node, a change in self-capacitance may occur at the capacitive node and touch-sensor controller 12 may measure the change in capacitance, for example, as a change in the amount of charge needed to raise the voltage at the capacitive node by a pre-determined amount. As with a mutual-capacitance implementation, by measuring changes in capacitance throughout the array, touch-sensor controller 12 may determine the position of the touch or proximity within the touch-sensitive area(s) of touch sensor 10. This disclosure contemplates any suitable form of capacitive touch sensing, where appropriate.

In particular embodiments, one or more drive electrodes may together form a drive line running horizontally or vertically or in any suitable orientation. Similarly, one or more sense electrodes may together form a sense line running horizontally or vertically or in any suitable orientation. In particular embodiments, drive lines may run substantially perpendicular to sense lines. Herein, reference to a drive line may encompass one or more drive electrodes making up the drive line, and vice versa, where appropriate. Similarly, reference to a sense line may encompass one or more sense electrodes making up the sense line, and vice versa, where appropriate.

Touch sensor 10 may have drive and sense electrodes disposed in a pattern on one side of a single substrate. In such a configuration, a pair of drive and sense electrodes capacitively coupled to each other across a space between them may form a capacitive node. For a self-capacitance implementation, electrodes may be disposed in a pattern on a single substrate. In addition or as an alternative to having drive and sense electrodes disposed in a pattern on one side of a single substrate, touch sensor 10 may have drive electrodes disposed in a pattern on one side of a substrate and sense electrodes disposed in a pattern on another side of the substrate. Moreover, touch sensor 10 may have drive electrodes disposed in a pattern on one side of one substrate and sense electrodes disposed in a pattern on one side of another substrate. In such configurations, an intersection of a drive electrode and a sense electrode may form a capacitive node. Such an intersection may be a location where the drive electrode and the sense electrode "cross" or come nearest each other in their respective planes. The drive and sense electrodes do not make electrical contact with each other—instead they are capacitively coupled to each other across a dielectric at the intersection. Although this disclosure describes particular configurations of particular electrodes forming particular nodes, this disclosure contemplates any suitable configuration of any suitable electrodes forming any suitable nodes. Moreover, this disclosure contemplates any suitable electrodes disposed on any suitable number of any suitable substrates in any suitable patterns.

As described above, a change in capacitance at a capacitive node of touch sensor 10 may indicate a touch or proximity input at the position of the capacitive node. Touch-sensor controller 12 may detect and process the change in capacitance to determine the presence and location of the touch or proximity input. Touch-sensor controller 12 may then communicate information about the touch or proximity input to one or more other components (such one or more central processing units (CPUs)) of a device that includes touch sensor 10 and touch-sensor controller 12, which may respond to the touch or proximity input by initiating a function of the device (or an application running on the device). Although this disclosure describes a particular touch-sensor controller having particular functionality with respect to a particular device and a particular touch sensor, this disclosure contemplates any suitable touch-sensor controller having any suitable functionality with respect to any suitable device and any suitable touch sensor.

Touch-sensor controller 12 may be one or more integrated circuits (ICs), such as for example general-purpose microprocessors, microcontrollers, programmable logic devices or arrays, application-specific ICs (ASICs). In particular embodiments, touch-sensor controller 12 comprises analog circuitry, digital logic, and digital non-volatile memory. In particular embodiments, touch-sensor controller 12 is disposed on a flexible printed circuit (FPC) bonded to the substrate of touch sensor 10, as described below. The FPC may be active or passive, where appropriate. In particular embodiments, multiple touch-sensor controllers 12 are disposed on the FPC. Touch-sensor controller 12 may include a processor unit, a drive unit, a sense unit, and a storage unit. The drive unit may supply drive signals to the drive electrodes of touch sensor 10. The sense unit may sense charge at the capacitive nodes of touch sensor 10 and provide measurement signals to the processor unit representing capacitances at the capacitive nodes. The processor unit may control the supply of drive signals to the drive electrodes by the drive unit and process measurement signals from the sense unit to detect and process the presence and location of a touch or proximity input within the touch-sensitive area(s) of touch sensor 10. The processor unit may also track changes in the position of a touch or proximity input within the touch-sensitive area(s) of touch sensor 10. The storage unit may store programming for execution by the processor unit, including programming for controlling the drive unit to supply drive signals to the drive electrodes, programming for processing measurement signals from the sense unit, and other suitable programming, where appropriate. Although this disclosure describes a particular touch-sensor controller having a particular implementation with particular components, this disclosure contemplates any suitable touch-sensor controller having any suitable implementation with any suitable components.

Tracks 14 of conductive material disposed on the substrate of touch sensor 10 may couple the drive or sense electrodes of touch sensor 10 to connection pads 16, also disposed on the substrate of touch sensor 10. As described below, connection pads 16 facilitate coupling of tracks 14 to touch-sensor controller 12. Tracks 14 may extend into or around (e.g. at the edges of) the touch-sensitive area(s) of touch sensor 10. Particular tracks 14 may provide drive connections for coupling touch-sensor controller 12 to drive electrodes of touch sensor 10, through which the drive unit of touch-sensor controller 12 may supply drive signals to the drive electrodes. Other tracks 14 may provide sense connections for coupling touch-sensor controller 12 to sense electrodes of touch sensor 10, through which the sense unit of touch-sensor controller 12 may sense charge at the capacitive nodes of touch sensor 10. Tracks 14 may be made of fine lines of metal or other conductive material. As an example and not by way of limitation, the conductive material of tracks 14 may be copper or copper-based and have a width of approximately 100 µm or less. As another example, the conductive material of tracks 14 may be silver or silver-based and have a width of approximately 100 µm or less. In particular embodiments, tracks 14 may be made of ITO in whole or in part in addition or as an alternative to fine lines of metal or other conductive material. Although this disclosure describes particular tracks made of particular materials with particular widths, this disclosure contemplates any suitable tracks made of any suitable materials with any suitable widths. In addition to tracks 14, touch sensor 10 may include one or more ground lines terminating at a ground connector (which may be a connection pad 16) at an edge of the substrate of touch sensor 10 (similar to tracks 14).

Connection pads 16 may be located along one or more edges of the substrate, outside the touch-sensitive area(s) of touch sensor 10. As described above, touch-sensor controller 12 may be on an FPC. Connection pads 16 may be made of the same material as tracks 14 and may be bonded to the FPC using an anisotropic conductive film (ACF). Connection 18 may include conductive lines on the FPC coupling touch-sensor controller 12 to connection pads 16, in turn coupling touch-sensor controller 12 to tracks 14 and to the drive or sense electrodes of touch sensor 10. In another embodiment, connection pads 16 may be connected to an electro-mechanical connector (such as a zero insertion force wire-to-board connector); in this embodiment, connection 18 may not need to include an FPC. This disclosure contemplates any suitable connection 18 between touch-sensor controller 12 and touch sensor 10.

Figure 2A:
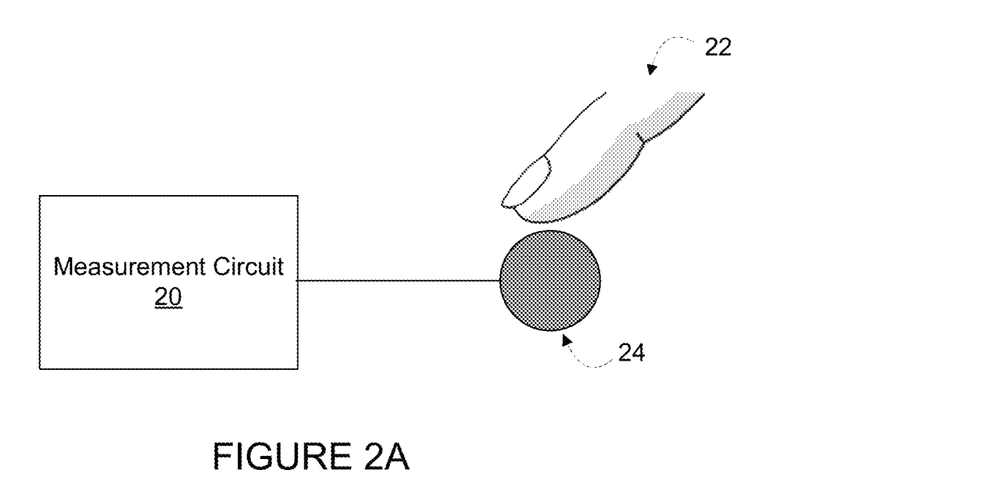
FIGS. 2A-2B illustrate example self-capacitance measurement.
Figure 2B:
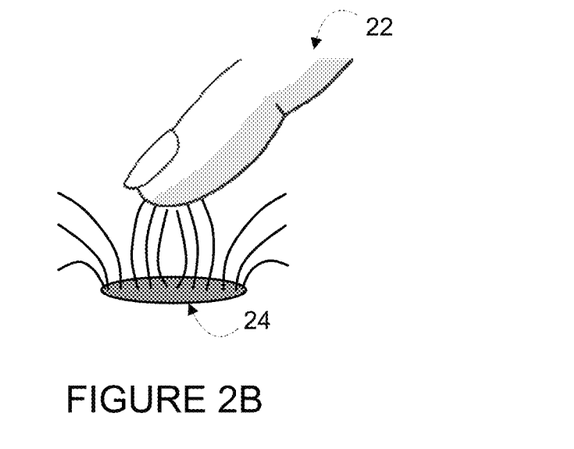

FIGS. 2A-2B illustrate example self-capacitance measurement. In the example of FIG. 2A, an electrode 24 of the touch sensor is coupled to a measurement circuit 20. As described below, electrode 24 forms a capacitance to ground that is distributed in the space. In particular embodiments, the capacitance to ground may include multiple elements, such as for example, capacitance of the tracks in the silicon, tracks on the printed circuit board (PCB), electrodes 24 made from conductive material (ITO, copper mesh, etc.), or an object providing a touch input. Electrode 24 has capacitive coupling to ground through the surrounding objects that are galvanically or capacitively connected to ground. As described above, measurement circuit 20 of the touch-sensor controller transmits a drive signal and senses a signal indicative of a touch or proximity input, from for example a finger 22, through electrode 24. In particular embodiments, measurement circuit 20 of the touch-sensor controller generates the drive signal transmitted by electrode 24 and senses the capacitance to ground. The capacitance of the surrounding material includes at least in part, the capacitance between electrode 24 and ground with finger 22 providing the touch or proximity input. As an example and not by way of limitation, the capacitance provided by finger 22 providing the touch or proximity input may add 5-10% of the capacitance sensed by electrode 24.

In the example of FIG. 2B, the drive signal transmitted by electrode 24 generates an electric field that emanates from electrode 24 to a signal ground of the touch sensor. The signal ground is galvanically or capacitively coupled to ground. The presence of finger 22 effects the electric field and in turn the amount of charge sensed at electrode 24 by measurement circuit 20. As finger 22 approaches electrode 24, the capacitance between electrode 24 and ground detected by the measurement circuit 20 increases. Although this disclosure describes the measurement circuit being integrated with a touch-sensor controller, this disclosure contemplates a measurement circuit being a discrete circuit or part of any suitable circuit.

Figure 3A:
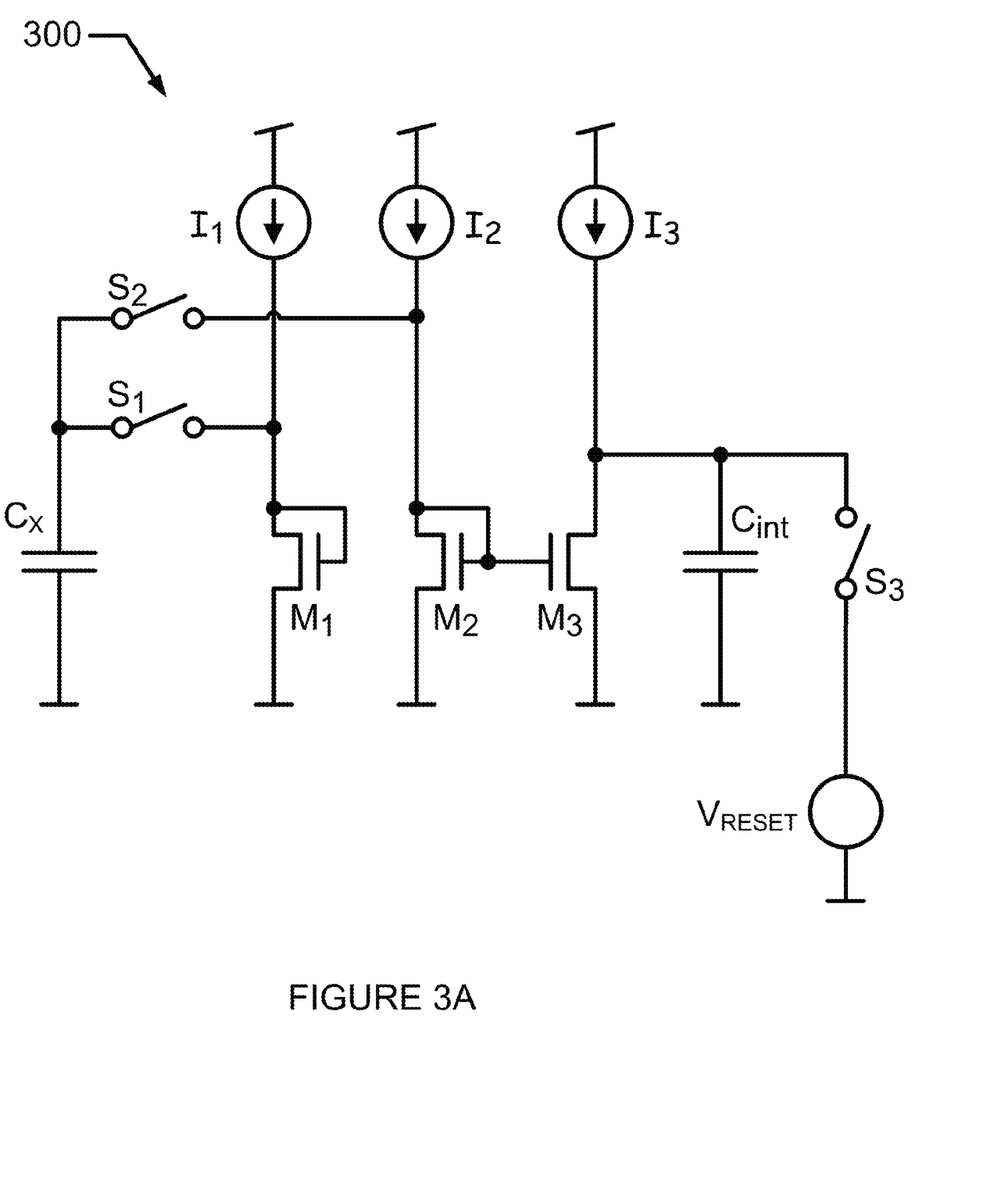
FIGS. 3A-3B illustrate an example circuit for example self-capacitance measurements.

FIG. 3A illustrates an example circuit for example self-capacitance measurements. Self-capacitance measurement circuit 300 determines a change of a touch sensor capacitance schematically illustrated in the example of FIG. 3A by measurement capacitance $C_X$. In particular embodiments, measurement capacitance $C_X$ may be formed in part between an electrode of the touch sensor and a touch object, e.g. finger, capacitively or galvanically coupled to ground. As an example and not by way of limitation, the conductive material of the touch sensor may include portions of tracks, pins, or internal network of the touch sensor. As described above, the electrode of the touch sensor senses the capacitance between the electrode and ground with the finger providing the touch or proximity input through the electric field transmitted by the electrode.

In the example of FIG. 3A, one terminal of measurement capacitance $C_X$ is coupled to the drain terminal of transistor $M_1$ and current source $I_1$ through switch $S_1$. The same terminal of measurement capacitance $C_X$ is also coupled to the drain terminal of transistor $M_2$ and current source $I_2$ through switch $S_2$. The other terminal of measurement capacitance $C_X$ is coupled to ground. The source terminals of transistors $M_1$ and $M_2$ are coupled to ground. The drain terminal and the gate terminal are coupled together in transistor $M_1$ (often referred as a diode-connected transistor), such that the voltage at the gate terminal $V_{GS}(M_1)$ is a function of a current flowing out of (or into) current source $I_1$ and transistor parameters (e.g., threshold voltage, gate dimensions, etc.) of transistor $M_1$. Similarly, the drain terminal and the gate terminal of transistor are coupled together in transistor $M_2$, such that the voltage at the gate terminal $V_{GS}(M_2)$ is a function of a current flowing out of (or into) current source $I_2$ and transistor parameters of transistor $M_2$. The gate terminal of transistor $M_2$ is coupled to the gate terminal of transistor $M_3$. The drain terminal of transistor $M_3$ is coupled to current source $I_3$. The source terminal of transistor $M_3$ are coupled to ground. $I_1$, $I_2$, and $I_3$ are direct-current (DC) current sources for biasing transistors $M_1$, $M_2$, and $M_3$, respectively. For example, if transistor $M_3$ is identical to $M_2$, then current sources $I_3$ and $I_2$ may have the same current value. Transistors $M_2$ and $M_3$ form a current mirror in that a current flowing out of (or into) transistor $M_3$ is proportional to a current flowing out of (or into) transistor $M_2$. The drain terminal of transistor $M_3$ is coupled to $C_{int}$, such that a current flowing out of (or into) transistor $M_3$ is integrated into integration capacitor $C_{int}$. Integration capacitor $C_{int}$ is also coupled to voltage source $V_{RESET}$ through switch $S_3$, such that the voltage of integration capacitor $C_{int}$ may be reset to a reference voltage of voltage source $V_{RESET}$. The voltage at integration capacitor $C_{int}$ may be measured by an analog-to-digital converter (ADC). This disclosure contemplates any suitable methods for measuring the voltage at integration capacitor $C_{int}$.

Although FIG. 3A illustrates transistors $M_1$, $M_2$, and $M_3$ being n-type metal-oxide-semiconductor (NMOS) transistors, this disclosure contemplates any suitable components for transistors $M_1$, $M_2$, and $M_3$. For example and without limitation, transistors $M_1$, $M_2$, and $M_3$ may comprise NMOS transistors, p-type metal-oxide-semiconductor (PMOS) transistors, bipolar junction transistors (BJT's), or any suitable combination of those components.

The example self-capacitance measurement circuit 300 illustrated in FIG. 3A does not rely upon any external references, rather uses the relative difference in $V_{GS}$ between diode-connected transistors $M_1$ and $M_2$. Since $M_1$ and $M_2$ are of the same type of devices, $M_1$ and $M_2$ may track each other with respect to variations in manufacturing process, voltage, and temperature. Self-capacitance measurement circuit 300 may measure changes in measurement capacitance $C_X$ due to touch or proximity inputs by switching measurement capacitance $C_X$ between different reference voltages. In particular embodiments, self-capacitance measurement circuit 300 may connect measurement capacitance $C_X$ to a first reference voltage $V_{GS}(M_1)$ at the gate terminal of transistor $M_1$. In particular embodiments, self-capacitance measurement circuit 300 may then connect measurement capacitance $C_X$ to a second reference voltage $V_{GS}(M_2)$ at the gate terminal of transistor $M_2$. If the second reference voltage $V_{GS}(M_2)$ is lower than the first reference voltage $V_{GS}(M_1)$, the excess charge stored in measurement capacitance $C_X$ may be discharged through transistor $M_2$, resulting a discharging current flowing through transistor $M_2$. Similarly, if the second reference voltage $V_{GS}(M_2)$ is higher than the first reference voltage $V_{GS}(M_1)$, additional charge is required in measurement capacitance $C_X$, resulting a charging current flowing through transistor $M_2$. As transistors $M_2$ and $M_3$ form a current mirror, the discharging (or charging) current through transistor $M_2$ may result in a mirrored current (proportional to the discharging current) being flown from transistor $M_3$ into integration capacitor $C_{int}$. That is, a voltage $V(C_{int})$ at integration capacitor $C_{int}$ that corresponds to charge integrated from the mirrored current represents a portion of charge stored in measurement capacitance $C_X$. Meanwhile, a touch or proximity input may result in an increase in charge stored in measurement capacitance $C_X$, causing an increase in the voltage $V(C_{int})$ at integration capacitor $C_{int}$. Thus capacitance measurement circuit 300 may detect a touch or proximity input by detecting an increase of the voltage $V(C_{int})$ at integration capacitor $C_{int}$.

As transistors $M_1$, $M_2$, and $M_3$ are of the same type of devices and can be disposed in close proximity in each other on a substrate (e.g., of a semiconductor chip), their transistor parameters may be substantially matched as designed. Furthermore, given their close proximity, their transistor parameters may track variations in supply voltage, and temperature in the same direction. That is, capacitance measurement circuit 300 can be substantially immune to variations in manufacturing process, supply voltage, and temperature. Furthermore, capacitance measurement circuit 300 uses the relative difference in $V_{GS}$ between diode-connected transistors $M_1$ and $M_2$. This is more advantageous than capacitance sensing circuits that rely on external reference voltages, as external reference voltages can easily vary due to changes in manufacturing and the environment (e.g., temperature).

Figure 4:
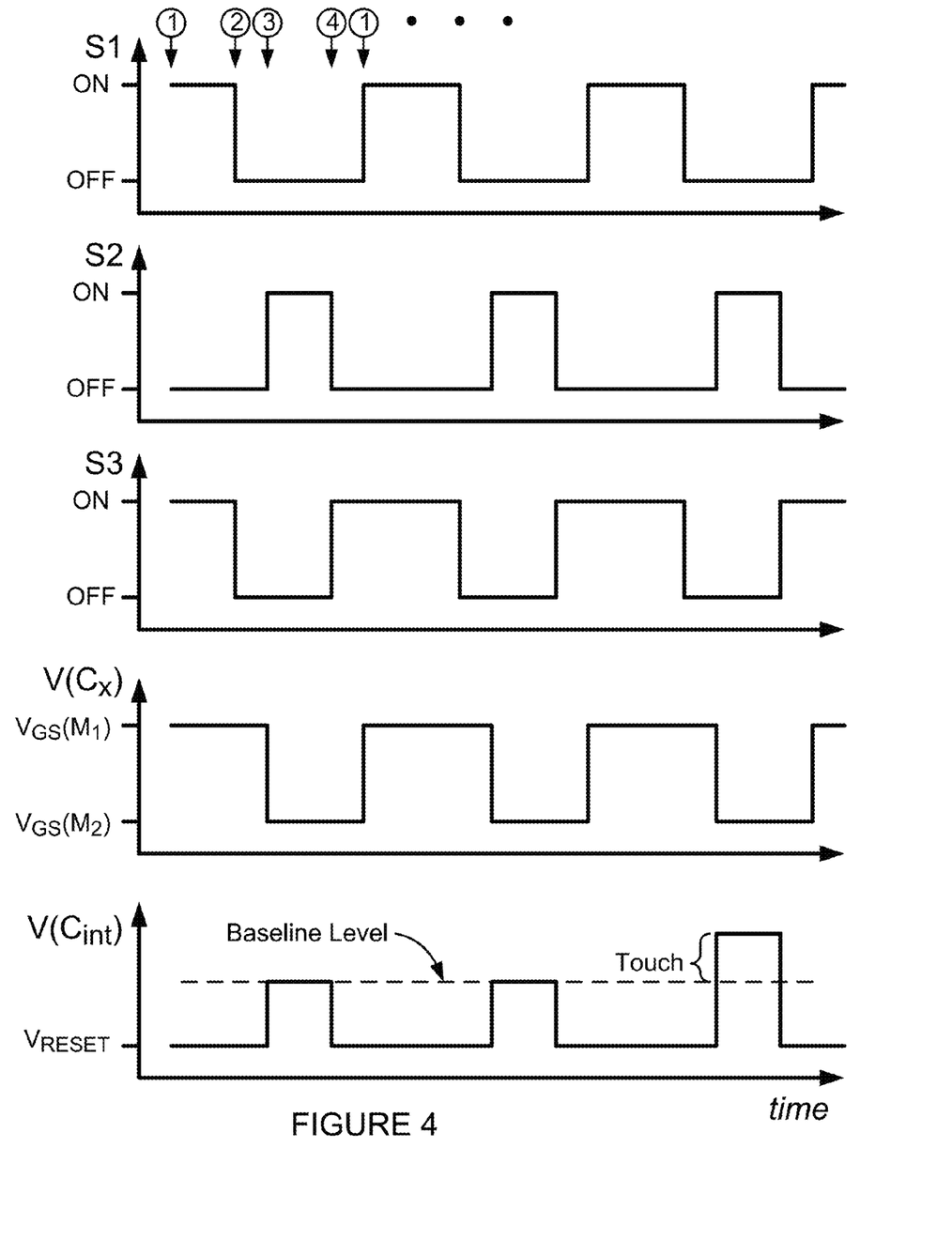
FIG. 4 illustrates example waveforms for example self-capacitance measurements.

FIG. 4 illustrates example waveforms for measurement capacitance $C_X$ and integration capacitor $C_{int}$ over time for capacitance measurement circuit 300. In particular embodiments, capacitance measurement circuit 300 may modify the voltage $V(C_X)$ at measurement capacitance $C_X$ to the first reference voltage $V_{GS}(M_1)$ by closing switch $S_1$ and opening switch $S_2$ at time instance "1" as illustrated in FIG. 4. Meanwhile, capacitance measurement circuit 300 may modify the voltage $V(C_{int})$ at integration capacitor $C_{int}$ to a reference voltage of voltage source $V_{RESET}$ by closing switch $S_3$ at time instance "1." In particular embodiments, capacitance measurement circuit 300 may disconnect measurement capacitance $C_X$ from the first reference voltage $V_{GS}(M_1)$ by opening switch $S_1$ at time instance "2" as illustrated in FIG. 4. Meanwhile, capacitance measurement circuit 300 may disconnect integration capacitor $C_{int}$ from voltage source $V_{RESET}$ by opening switch $S_3$ at time instance "2." In particular embodiments, capacitance measurement circuit 300 may modify the voltage $V(C_X)$ at measurement capacitance $C_X$ to the second reference voltage $V_{GS}(M_2)$ by closing switch $S_2$ at time instance "3" as illustrated in FIG. 4. As described earlier, modifying the reference voltage at measurement capacitance $C_X$ (e.g., from $V_{GS}(M_1)$ to $V_{GS}(M_2)$) results in a discharging (or charging) current, which is proportionally mirrored to a current integrated into $C_{int}$, causing a change in the voltage at integration capacitor $C_{int}$. In particular embodiments, capacitance measurement circuit 300 may disconnect voltage at measurement capacitance $C_X$ from the second reference voltage $V_{GS}(M_2)$ by opening switch $S_2$ at time instance "4", as illustrated in FIG. 4. Meanwhile, capacitance measurement circuit 300 may connect integration capacitor $C_{int}$ to voltage source $V_{RESET}$ by closing switch $S_3$ at time instance "4", causing the voltage at integration capacitor $C_{int}$ being reset to the reference voltage $V_{RESET}$. In particular embodiments, capacitance measurement circuit 300 may repeat the sequence "1", "2", "3", and "4" one or more times, as illustrated in FIG. 4. By repeating the sequence and alternating the reference voltage at measurement capacitance $C_X$ between $V_{GS}(M_1)$ and $V_{GS}(M_2)$, changes in charge stored in measurement capacitance $C_X$ results in pulses in the waveform of the voltage $V(C_{int})$ at integration capacitor $C_{int}$ as illustrated in FIG. 4. Capacitance measurement circuit 300 may establish a baseline level of $V(C_{int})$ (e.g., an average voltage value for top of the pulses) corresponding to no touch or proximity input.

By establishing the baseline level of V($C_{int}$), in particular embodiments, capacitance measurement circuit 300 may detect a touch or proximity input by detecting a substantial change (e.g., a substantial increase) from the baseline level in one or more pulses, as illustrated in FIG. 4.

Figure 3B:
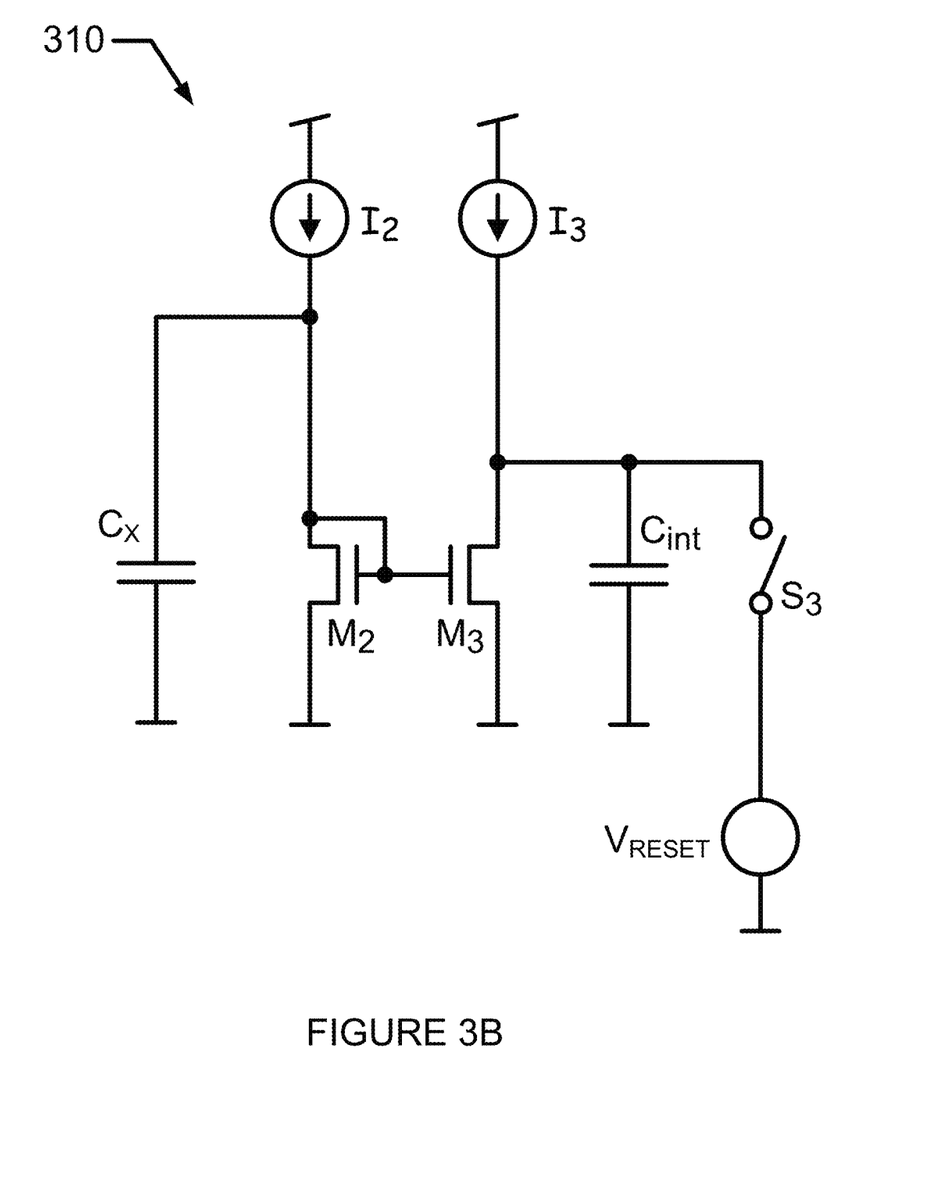
Figure 5:
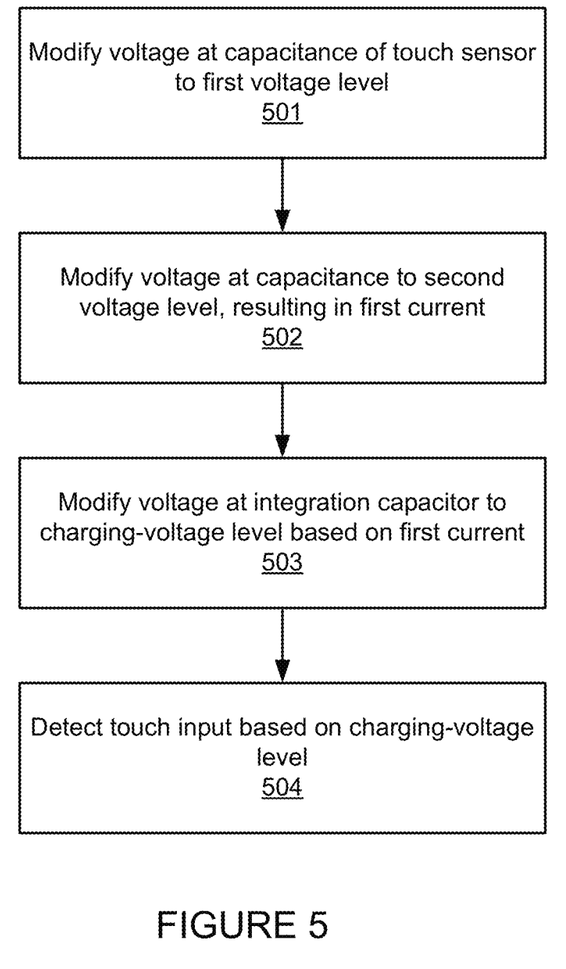
FIG. 5 illustrates an example method for self-capacitance measurement.

FIG. 5 illustrates an example method for self-capacitance measurement. The example method of FIG. 5 can be implemented with capacitance measurement circuit 300 and a controller (e.g., touch-sensor controller 12 illustrated in FIG. 1) that controls components (e.g., current source, switch, etc.) of capacitance measurement circuit 300 and measures the voltage level at integration capacitor $C_{int}$. In particular embodiments, the controller may modify a voltage at measurement capacitance $C_X$ to a first voltage level (STEP 501). For example, the controller may modify the voltage at measurement capacitance $C_X$ to gate voltage of transistor $M_1$ ($V_{GS}(M_1)$) by closing switch $S_1$. In particular embodiments, the controller may modify the voltage at measurement capacitance $C_X$ to a second voltage level, resulting in a first current (STEP 502). For example, the controller may modify the voltage at measurement capacitance $C_X$ to gate voltage of transistor $M_2$ ($V_{GS}(M_2)$) by opening switch $S_1$ and closing switch $S_2$. $V_{GS}(M_1)$ and $V_{GS}(M_2)$ can be different based on different transistor parameters between transistors $M_1$ and $M_2$. $V_{GS}(M_1)$ and $V_{GS}(M_2)$ can be different based on different currents provided by current sources $I_1$ and $I_2$, which may be controlled by the controller. The modification of the voltage at measurement capacitance $C_X$ from the first voltage level (e.g., $V_{GS}(M_1)$) to the second voltage level (e.g., $V_{GS}(M_1)$) may result in a discharging (or charging) current. FIG. 3B illustrates another example circuit for example self-capacitance measurements. In comparison to capacitance measurement circuit 300 (illustrated in FIG. 3A), capacitance measurement circuit 310 illustrated in FIG. 3B does not have transistor $M_1$, while measurement capacitance $C_X$ is coupled to the gate terminal of transistor $M_2$. Here, the voltage at measurement capacitance $C_X$ is $V_{GS}(M_2)$, which is a function of current source $I_2$. A controller may provide a first and a second voltage levels (in $V_{GS}(M_2)$) to measurement capacitance $C_X$ by adjusting current source $I_2$ between a first current value and a second current value. This disclosure contemplates any suitable methods for providing the first voltage level and the second voltage level to measurement capacitance $C_X$.

In particular embodiments, the controller may modify a voltage at integration capacitor $C_{int}$ to a charging-voltage level based on the first current (STEP 503). In particular embodiments, the controller may modify the voltage at integration capacitor $C_{int}$ to a charging-voltage level based on a second current which is proportional to the first current. For example, the controller may open switch $S_3$ while switch $S_1$ is open and switch $S_2$ is closed, causing a mirrored current (that's proportional to the discharging current) flowing into integration capacitor $C_{int}$. And the voltage at integration capacitor $C_{int}$ is modified to a charging-voltage level by an amount corresponding to charge integrated from the mirrored current. This disclosure contemplates any suitable methods for modifying the voltage at integration capacitor $C_{int}$ to a charging-voltage level based on the discharging current. In particular embodiments, the controller may detect a touch or proximity input (i.e., whether a touch or proximity input has occurred) based on the charging-voltage level (STEP 504). As described earlier, the charging-voltage level may represent a portion of charge stored in measurement capacitance $C_X$. Meanwhile, a touch or proximity input may result in an increase in charge stored in measurement capacitance $C_X$, causing a corresponding increase in the charging-voltage level at integration capacitor $C_{int}$. That is, the controller may detect a touch or proximity input by detecting an increase in the charging-voltage level at integration capacitor $C_{int}$.

Particular embodiments may repeat the steps of the method of FIG. 5, where appropriate. Moreover, although this disclosure describes and illustrates particular steps of the method of FIG. 5 as occurring in a particular order, this disclosure contemplates any suitable steps of the method of FIG. 5 occurring in any suitable order. Furthermore, although this disclosure describes and illustrates particular components, devices, or systems carrying out particular steps of the method of FIG. 5, this disclosure contemplates any suitable combination of any suitable components, devices, or systems carrying out any suitable steps of the method of FIG. 5.

Herein, reference to a computer-readable storage medium encompasses one or more non-transitory, tangible computer-readable storage media possessing structure. As an example and not by way of limitation, a computer-readable storage medium may include a semiconductor-based or other IC (such, as for example, a field-programmable gate array (FPGA) or an ASIC), a hard disk, an HDD, a hybrid hard drive (HHD), an optical disc, an optical disc drive (ODD), a magneto-optical disc, a magneto-optical drive, a floppy disk, a floppy disk drive (FDD), magnetic tape, a holographic storage medium, a solid-state drive (SSD), a RAM-drive, a SECURE DIGITAL card, a SECURE DIGITAL drive, or another suitable computer-readable storage medium or a combination of two or more of these, where appropriate.

Herein, "or" is inclusive and not exclusive, unless expressly indicated otherwise or indicated otherwise by context. Therefore, herein, "A or B" means "A, B, or both," unless expressly indicated otherwise or indicated otherwise by context. Moreover, "and" is both joint and several, unless expressly indicated otherwise or indicated otherwise by context. Therefore, herein, "A and B" means "A and B, jointly or severally," unless expressly indicated otherwise or indicated otherwise by context.

This disclosure encompasses all changes, substitutions, variations, alterations, and modifications to the example embodiments herein that a person having ordinary skill in the art would comprehend. Moreover, although this disclosure describes and illustrates respective embodiments herein as including particular components, elements, functions, operations, or steps, any of these embodiments may include any combination or permutation of any of the components, elements, functions, operations, or steps described or illustrated anywhere herein that a person having ordinary skill in the art would comprehend. Furthermore, reference in the appended claims to an apparatus or system or a component of an apparatus or system being adapted to, arranged to, capable of, configured to, enabled to, operable to, or operative to perform a particular function encompasses that apparatus, system, component, whether or not it or that particular function is activated, turned on, or unlocked, as long as that apparatus, system, or component is so adapted, arranged, capable, configured, enabled, operable, or operative.

What is claimed is:

1. A method comprising:
    modifying a voltage at a capacitance of a self-capacitance measurement circuit of a touch sensor to a first voltage level, a terminal of the capacitance coupled to ground;
    modifying the voltage at the capacitance to a second voltage level, resulting in a first current, the terminal of the capacitance coupled to the ground;
    substantially continuously alternating the voltage at the capacitance between the first voltage level and the second voltage level, the first and second voltage levels being generated by respective diode voltages;

modifying a voltage at an integration capacitor to a charging-voltage level based on a second current that is proportional to the first current; and determining whether a touch input to the touch sensor has occurred based on the charging-voltage level.

2. The method of claim 1, wherein the voltage at the integration capacitor is modified to the charging-voltage level from a reference-voltage level.

3. The method of claim 1, wherein the first voltage level is higher than the second voltage level.

4. The method of claim 1, wherein the determining whether a touch input to the touch sensor has occurred based on the charging-voltage level comprises detecting an increase in the charging-voltage level.

5. The method of claim 1, wherein the diode voltages substantially match each other with respect to manufacturing process, supply voltage, or temperature variations.

6. A computer-readable non-transitory storage medium embodying logic configured, when executed by a processor, to cause the processor to:

modify a voltage at a capacitance of a self-capacitance measurement circuit of a touch sensor to a first voltage level, a terminal of the capacitance coupled to ground;

modify the voltage at the capacitance to a second voltage level, resulting in a first current, the terminal of the capacitance coupled to the ground;

substantially continuously alternate the voltage at the capacitance between the first voltage level and the second voltage level, the first and second voltage levels being generated by respective diode voltages;

modify a voltage at an integration capacitor to a charging-voltage level based on a second current that is proportional to the first current; and determine whether a touch input to the touch sensor has occurred based on the charging-voltage level.

7. The medium of claim 6, wherein the voltage at the integration capacitor is modified to the charging-voltage level from a reference-voltage level.

8. The medium of claim 6, wherein the first voltage level is higher than the second voltage level.

9. The medium of claim 6, wherein to determine whether a touch input to the touch sensor has occurred based on the charging-voltage level, the logic is configured to cause the processor to detect an increase in the charging-voltage level.

10. The medium of claim 6, wherein the diode voltages substantially match each other with respect to manufacturing process, supply voltage, or temperature variations.

11. A device comprising:

a touch sensor; and a computer-readable non-transitory storage medium coupled to the touch sensor and embodying logic configured, when executed by a processor, to cause the processor to:

modify a voltage at a capacitance of a self-capacitance measurement circuit of the touch sensor to a first voltage level, a terminal of the capacitance coupled to ground;

modify the voltage at the capacitance to a second voltage level, resulting in a first current, the terminal of the capacitance coupled to the ground;

substantially continuously alternate the voltage at the capacitance between the first voltage level and the second voltage level, the first and second voltage levels being generated by respective diode voltages;

modify a voltage at an integration capacitor to a charging-voltage level based on a second current that is proportional to the first current; and determine whether a touch input to the touch sensor has occurred based on the charging-voltage level.

12. The device of claim 11, wherein the voltage at the integration capacitor is modified to the charging-voltage level from a reference-voltage level.

13. The device of claim 11, wherein the first voltage level is higher than the second voltage level.

14. The device of claim 11, wherein to determine whether a touch input to the touch sensor has occurred based on the charging-voltage level, the logic is configured to cause the processor to detect an increase in the charging-voltage level.

* * * * *